US012713629B2

(12) United States Patent
West et al.

(10) Patent No.: US 12,713,629 B2
(45) Date of Patent: Aug. 18, 2026

(54) WIRE BONDS FOR GALVANIC ISOLATION DEVICE

(71) Applicant: Texas Instruments Incorporated, Dallas, TX (US)

(72) Inventors: Jeffrey Alan West, Dallas, TX (US); Hung-Yu Chou, Taipei City (TW); Byron Lovell Williams, Plano, TX (US); Thomas Dyer Bonifield, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 765 days.

(21) Appl. No.: 18/146,591

(22) Filed: Dec. 27, 2022

(65) Prior Publication Data

US 2024/0113155 A1 Apr. 4, 2024

Related U.S. Application Data

(60) Provisional application No. 63/411,942, filed on Sep. 30, 2022.

(51) Int. Cl.
*H10D 1/20* (2025.01)
*H10W 72/00* (2026.01)
(Continued)

(52) U.S. Cl.
CPC ............ *H10D 1/20* (2025.01); *H10W 72/547* (2026.01); *H10W 74/016* (2026.01);
(Continued)

(58) Field of Classification Search
CPC ..... H10D 1/20; H01L 21/565; H01L 23/3121; H01L 24/45; H01L 24/48; H01L 24/49;
(Continued)

(56) References Cited

U.S. PATENT DOCUMENTS 7,015,587 B1 * 3/2006 Poddar .................... H01L 24/83 438/109
2008/0286959 A1 * 11/2008 Chia ....................... H01L 24/85 257/E21.476

(Continued)

OTHER PUBLICATIONS

Liew, et al. "Reliable Ultra-low-loop Bonding Approach on X2/X3 thin QFN." In 2012 35th IEEE/CPMT International Electronics Manufacturing Technology Conference (IEMT), pp. 1-5. IEEE, 2012.

(Continued)

*Primary Examiner* — Mounir S Amer
*Assistant Examiner* — Nicholas B Michaud
(74) *Attorney, Agent, or Firm* — Xiaotun Qiu; Frank D. Cimino

(57) ABSTRACT

A microelectronic device includes a galvanic isolation component having a lower isolation element over a substrate with lower bond pads connected to the lower isolation element, a dielectric plateau over the lower isolation element that does not extend to the lower bond pads, and an upper isolation element and upper bond pads over the dielectric plateau. The upper bond pads are laterally separated from the lower bond pads by an isolation distance. The microelectronic device includes high voltage wire bonds on the upper bond pads that extend upward, within 10 degrees of vertical, for a vertical distance greater than the isolation distance. The microelectronic device further includes low voltage wire bonds on the lower bond pads that have a loop height directly over a perimeter of the substrate that is less than 5 times a wire diameter of the low voltage wire bonds.

15 Claims, 17 Drawing Sheets

(51) Int. Cl.
*H10W 72/50* (2026.01)
*H10W 74/01* (2026.01)
*H10W 74/10* (2026.01)
*H10W 90/00* (2026.01)

(52) U.S. Cl.
CPC .......... *H10W 74/114* (2026.01); *H10W 90/00* (2026.01); *H10W 72/07552* (2026.01); *H10W 72/07553* (2026.01); *H10W 72/07554* (2026.01); *H10W 72/521* (2026.01); *H10W 72/527* (2026.01); *H10W 72/536* (2026.01); *H10W 72/5363* (2026.01); *H10W 72/5366* (2026.01); *H10W 72/537* (2026.01); *H10W 72/552* (2026.01); *H10W 72/5525* (2026.01); *H10W 72/555* (2026.01); *H10W 90/756* (2026.01); *H10W 90/759* (2026.01)

(58) Field of Classification Search
CPC ......... H01L 25/167; H01L 2224/45147; H01L 2224/45664; H01L 2224/48011; H01L 2224/48091; H01L 2224/48095; H01L 2224/48195; H01L 2224/48245; H01L 2224/48465; H01L 2224/48471; H01L 2224/4903; H01L 2224/49052; H01L 2224/49109; H01L 2924/1461; H01L 2924/3862; H01L 23/3107; H01L 23/3171; H01L 24/85; H01L 25/0655
USPC ................ 257/725, 723, 678, 738, 784, 659
See application file for complete search history.

(56) References Cited

U.S. PATENT DOCUMENTS

| | | | | |
|---|---|---|---|---|
| 2017/0278841 | A1* | 9/2017 | Palumbo | H04L 25/026 |
| 2019/0206812 | A1* | 7/2019 | Bonifield | H01L 25/0655 |
| 2020/0066678 | A1* | 2/2020 | Lee | H01L 24/85 |
| 2020/0105458 | A1 | 4/2020 | Massolini et al. | |
| 2020/0312794 | A1* | 10/2020 | West | H01L 25/18 |
| 2021/0280554 | A1* | 9/2021 | Tokubo | H01L 23/3107 |
| 2021/0376227 | A1* | 12/2021 | Latham | H01L 25/16 |

OTHER PUBLICATIONS

Ching, et al. “Characterization on ultra low loop Cu wire property and behavior.” In 2012 35th IEEE/CPMT International Electronics Manufacturing Technology Conference (IEMT), pp. 1-6. IEEE, 2012.

* cited by examiner

WIRE BONDS FOR GALVANIC ISOLATION DEVICE

CROSS-REFERENCE TO RELATED APPLICATIONS

This application claims the benefit of priority under 35 U.S.C. § 119(e) of U.S. Provisional Application No. 63/411,942, filed Sep. 30, 2022, which is hereby incorporated by reference in its entirety.

TECHNICAL FIELD

This disclosure relates to the field of galvanic isolation devices. More particularly, but not exclusively, this disclosure relates to wire bonds in galvanic isolation devices.

BACKGROUND

Galvanic isolation devices may be integrated into multi-chip modules with other devices. Connections to the galvanic isolation devices may be formed by wire bonds. The wire bonds must satisfy a variety of criteria, such as providing reliable electrical connections, reducing electric field stress on encapsulant material, and meeting package dimensional constraints.

SUMMARY

The present disclosure introduces a microelectronic device including a galvanic isolation component. The galvanic isolation component includes a lower isolation element over a substrate with lower bond pads connected to the lower isolation element. The galvanic isolation component also includes a dielectric plateau over the lower isolation element, wherein the dielectric plateau does not extend to the lower bond pads. The galvanic isolation component further includes an upper isolation element over the dielectric plateau with upper bond pads over the dielectric plateau, connected to the upper isolation element. The upper bond pads are laterally separated from the lower bond pads by an isolation distance. The microelectronic device includes high voltage wire bonds on the upper bond pads. Upper wires of the high voltage wire bonds extend upward, within 10 degrees of vertical, for a vertical distance greater than the isolation distance. The microelectronic device further includes low voltage wire bonds on the lower bond pads. The low voltage wire bonds have a loop height directly over a perimeter of the substrate that is less than 5 times a wire diameter of the low voltage wire bonds. Methods of forming the high voltage wire bonds and the low voltage wire bonds are disclosed.

DETAILED DESCRIPTION

Figure 1A:
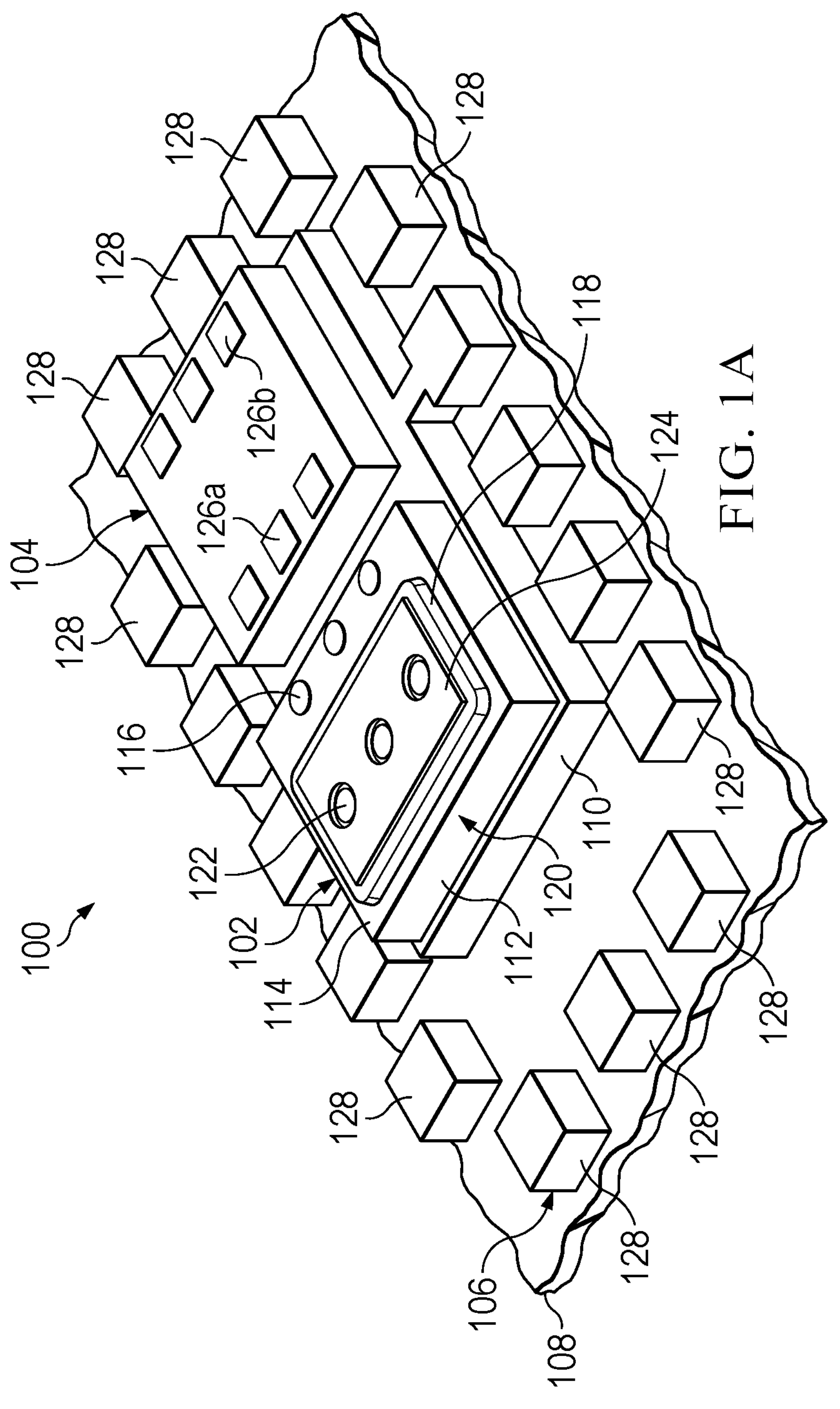
FIG. 1A through FIG. 1H are perspectives and cross sections of an example microelectronic device including a galvanic isolation device, depicted in stages of an example method of formation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

The following co-pending patent applications have related subject matter and are hereby incorporated by reference: U.S. patent application Ser. No. 17/957,847, titled "GALVANIC ISOLATION DEVICE", by West, et al.), Filed Sep. 30, 2022, and U.S. patent application Ser. No. 17/958,040, titled "SINGLE DIE REINFORCED GALVANIC ISOLATION DEVICE", by West, et al.), Filed Sep. 30, 2022. With their mention in this section, these patent applications are not admitted to be prior art with respect to the present invention.

For the purposes of this disclosure, a structure or component that is disclosed as including "primarily" a substance has more than 50 percent, by weight, of that substance. For example, an interconnect that is disclosed to include primarily aluminum has more than 50 percent, by weight, of the element aluminum.

For the purposes of this disclosure, the term "silicon dioxide" includes dielectric material which is primarily silicon dioxide with a few percent of hydrogen, water, hydroxyl groups, fluorine, or other material, by weight. The term silicon dioxide includes dielectric material formed by a PECVD process using TEOS and oxygen. The term silicon dioxide also includes dielectric material formed by a high density plasma (HDP) process using silane and oxygen.

For the purposes of this disclosure, organic material includes carbon-based polymers such as polyimide, benzocyclobutene (BCB), polybenzoxazole (PBO), or epoxy. For the purposes of this disclosure, organic material further includes carbon-silicon-based polymers, commonly referred to as silicone, such as polydimethylsiloxane (PDMS). For the purposes of this disclosure, organic material does not include organosilicate glass (OSG), also referred to as carbon-doped oxide (CDO), silicon carbide, silicon carbonitride, or silicon oxycarbonitride. For the purposes of this disclosure, organic material does not include silicon dioxide-based dielectric material formed from TEOS, or methylsilsesquioxane (MSQ).

For the purposes of this disclosure, the term "lateral" and "laterally" refer to directions parallel to a plane of the substrate of the galvanic isolation device under discussion. The terms "vertical" and "vertically" are understood to refer to directions perpendicular to the plane of the same substrate. The term "downward" is understood to refer to directions perpendicular to, and toward, the plane of the same substrate. The term "upward" is understood to refer to directions perpendicular to, and away from, the plane of the same substrate.

It is noted that terms such as top, bottom, front, back, over, above, under, and below may be used in this disclosure. These terms should not be construed as limiting the position or orientation of a structure or element, but should be used to provide spatial relationship between structures or elements. Similarly, words such as "inward" and "outward" would refer to directions toward and away from, respectively, the geometric center of a device or area and designated parts thereof.

FIG. 1A through FIG. 1H are perspectives and cross sections of an example microelectronic device including a galvanic isolation device, depicted in stages of an example method of formation. Referring to FIG. 1A, the microelectronic device 100 includes the galvanic isolation device 102 and an electronic component 104. The galvanic isolation device 102 may be implemented as an isolation transformer, an isolation capacitor, an optical isolator, or a magnetic isolator, by way of example. The electronic component 104 may be implemented as an integrated circuit, a discrete component, a sensor, a microelectrical mechanical system (MEMS) device, or an optoelectronic device, by way of example.

In this example, the galvanic isolation device 102 and the electronic component 104 may be mounted on a lead frame 106. The lead frame 106 may be supported by a dicing tape 108 during formation of the microelectronic device 100. The dicing tape 108 may support additional instances of microelectronic devices, not shown, up through singulation of the microelectronic device 100.

The galvanic isolation device 102 and the electronic component 104 may be attached to a die pad 110 of the lead frame 106. The die pad 110 may be electrically conductive, and may include copper, for example. The galvanic isolation device 102 and the electronic component 104 may be attached to the die pad 110 with conductive adhesive, solder, or non-conductive adhesive, by a pick-and-place operation. In an alternate version of this example, the galvanic isolation device 102 and the electronic component 104 may be attached to separate die pads of the lead frame 106.

The galvanic isolation device 102 includes a substrate 112, and a lower dielectric layer 114 over the substrate 112. The substrate 112 may include a semiconductor material, not specifically shown. The lower dielectric layer 114 may include inorganic dielectric material, such as silicon dioxide and silicon nitride. The galvanic isolation device 102 includes lower bond pads 116 over the lower dielectric layer 114. The lower bond pads 116 are connected to a lower isolation element 138, shown in FIG. 1F, of the galvanic isolation device 102. The lower bond pads 116 may include aluminum, by way of example, and have a surface suitable for wire bonding. The lower isolation element 138 is electrically conductive, may include aluminum, and may be manifested as a lower winding of an isolation transformer or as a lower capacitor plate of an isolation capacitor, by way of example.

The galvanic isolation device 102 includes a dielectric plateau 118 over the lower isolation element and the lower dielectric layer 114. The dielectric plateau 118 does not extend to the lower bond pads 116, and may not extend to a perimeter 120 of the substrate 112.

The galvanic isolation device 102 includes upper bond pads 122 over the dielectric plateau 118. The upper bond pads 122 are connected to an upper isolation element 140, shown in FIG. 1F, located over the dielectric plateau 118, above the lower isolation element. The upper bond pads 122 may include aluminum, and have a surface suitable for wire bonding. The upper isolation element 140 is electrically conductive, may include aluminum, and may be manifested as an upper winding of the isolation transformer or as an upper capacitor plate of the isolation capacitor. The dielectric plateau 118 may include inorganic dielectric material extending from the lower isolation element 138 to the upper isolation element 140.

The galvanic isolation device 102 may optionally include a protective layer 124 over the upper isolation element, exposing the upper bond pads 122. The protective layer 124 may include polyimide, by way of example.

The electronic component 104 includes first component bond pads **126*a* for connections to the galvanic isolation device 102, and second component bond pads 126*b* for other connections. The first component bond pads 126*a* and the second component bond pads 126*b*** may include aluminum, gold, or other metal suitable for wire bonding.

The lead frame 106 includes external leads 128 around a periphery of the microelectronic device 100. The external leads 128 are electrically conductive, and may have a similar composition to the die pad 110.

Figure 1B:
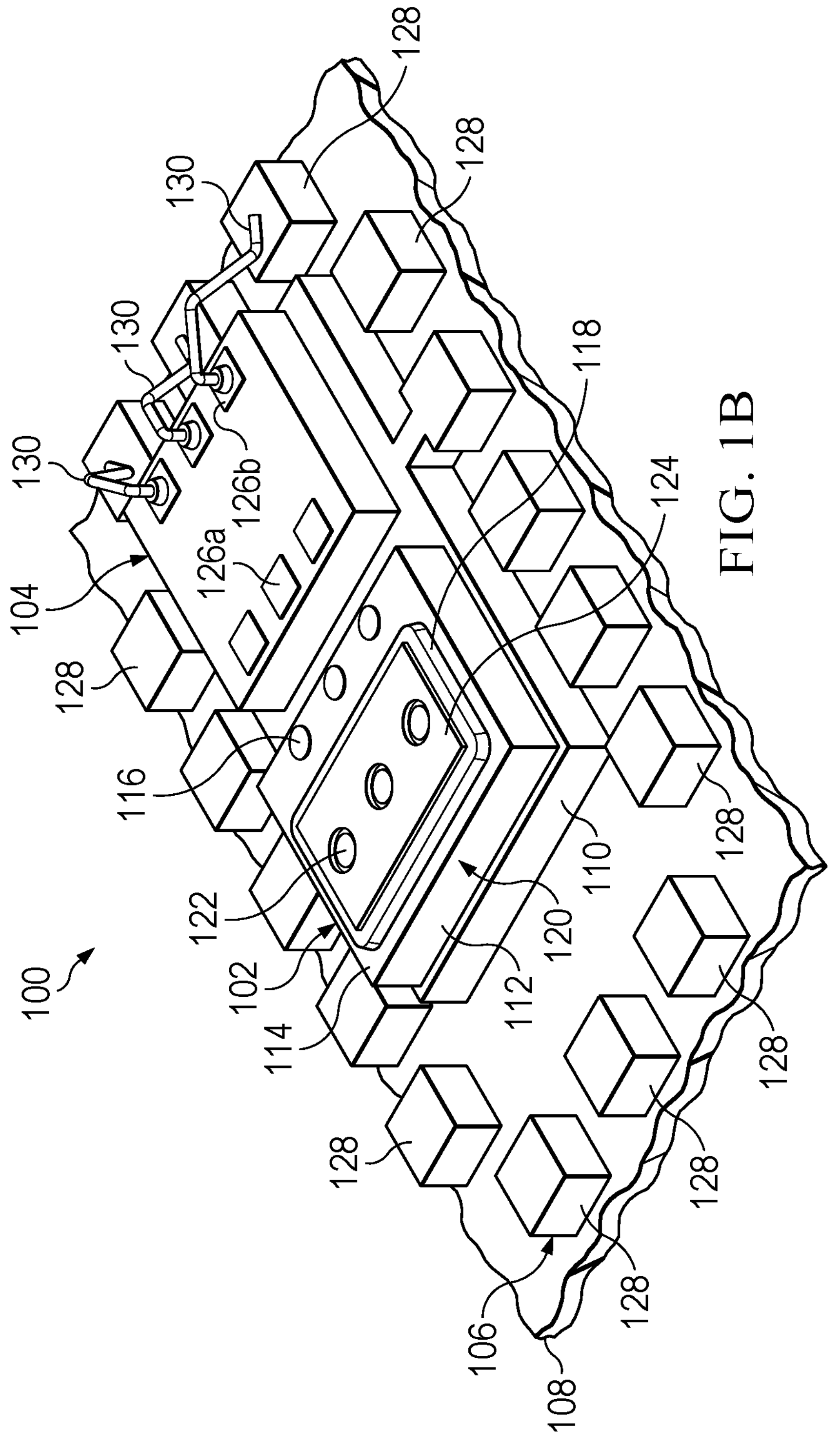

Referring to FIG. 1B, component wire bonds 130 are formed on the second component bond pads **126*b* of the electronic component 104 and instances of the external leads 128 of the lead frame 106, by a wire bond operation, connecting the second component bond pads 126*b* to the instances of the external leads 128. The component wire bonds 130 may include ball bonds on the second component bond pads 126*b* and stitch bonds on the external leads 128, as depicted in FIG. 1B. Other implementations of the component wire bonds 130, such as ball bonds on the external leads 128 and stitch bonds on the second component bond pads 126*b*, are within the scope of this example. The component wire bonds 130 may be formed using gold bonding wire, copper bonding wire, or palladium-coated copper bonding wire, by way of example. The component wire bonds 130** may have diameters of 15 microns to 30 microns, by way of example.

Figure 1C:
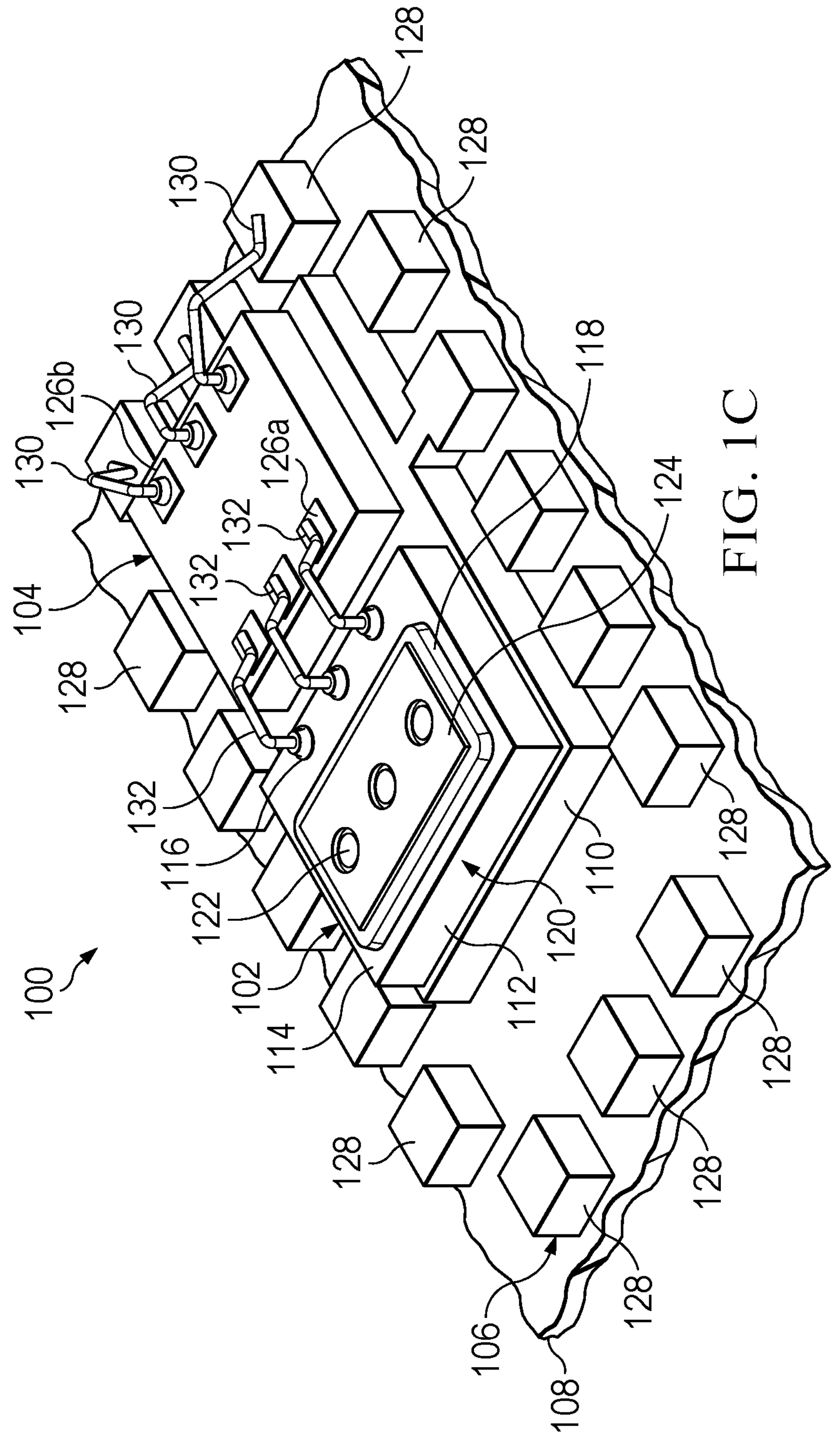

Referring to FIG. 1C, low voltage wire bonds 132 are formed on the lower bond pads 116 of the galvanic isolation device 102 and the first component bond pads **126*a* of the electronic component 104, by a wire bond operation, connecting the lower bond pads 116 to the first component bond pads 126*a*. The low voltage wire bonds 132 are formed with low loop heights having an arced configuration, as explained in reference to FIG. 1F. The low voltage wire bonds 132 may have compositions similar to the component wire bonds 130. The low voltage wire bonds 132 may include ball bonds on the lower bond pads 116 and stitch bonds on the first component bond pads 126*a*, as depicted in FIG. 1C. Other implementations of the low voltage wire bonds 132** are within the scope of this example.

Figure 1D:
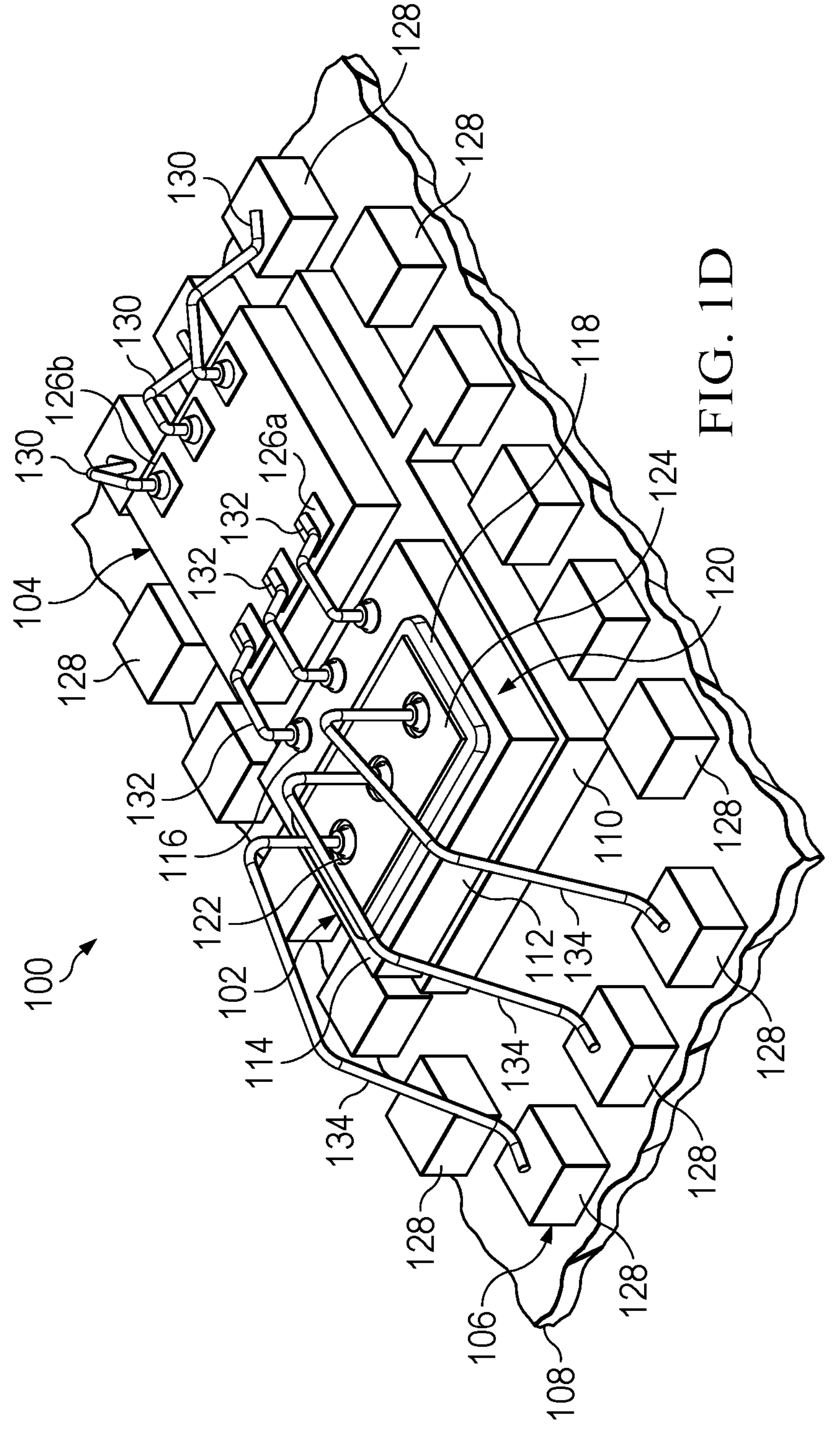

Referring to FIG. 1D, high voltage wire bonds 134 are formed on the upper bond pads 122 of the galvanic isolation device 102 and instances of the external leads 128, by a wire bond operation, connecting the upper bond pads 122 to the instances of the external leads 128. The high voltage wire bonds 134 extend upward from the upper bond pads 122 for a vertical distance that is greater than a lateral distance between the upper bond pads 122 and the lower bond pads 116. The high voltage wire bonds 134 may have compositions similar to the component wire bonds 130. The high voltage wire bonds 134 include ball bonds on the upper bond pads 122 and stitch bonds on the instances of the external leads 128, as depicted in FIG. 1D.

Figure 1E:
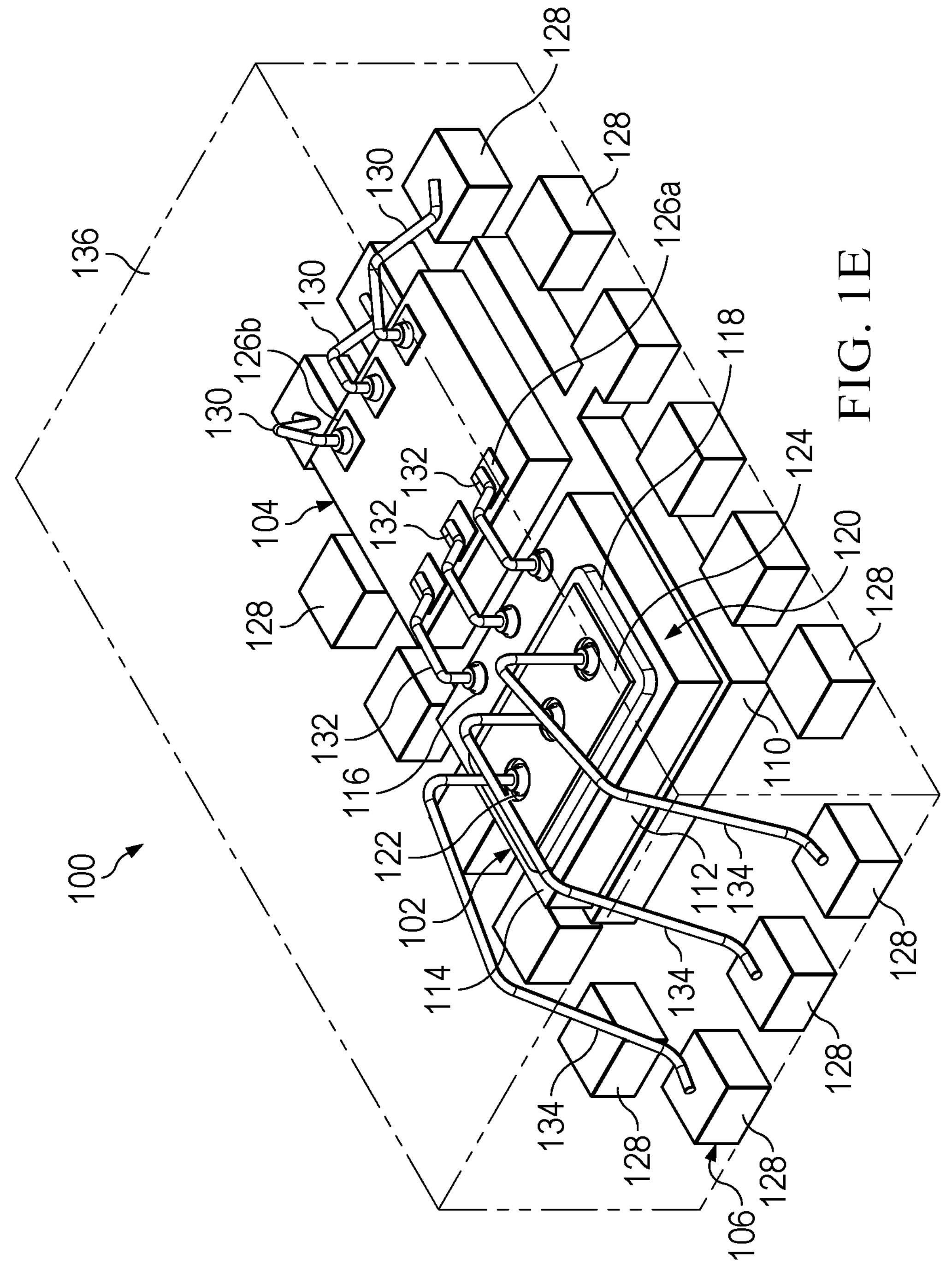

Referring to FIG. 1E, an encapsulant material 136 is formed on the lead frame 106, the galvanic isolation device 102, and the electronic component 104, surrounding the component wire bonds 130, the low voltage wire bonds 132, and the high voltage wire bonds 134. The encapsulant material 136 may include an organic polymer, such as epoxy.

The encapsulant material 136 may also include particles, not specifically shown, of inorganic dielectric material such as silicon dioxide or aluminum oxide, to reduce a thermal expansion coefficient of the encapsulant material 136. The encapsulant material 136 may be formed by an injection molding process or a reaction injection molding (RIM) process, by way of example.

After the encapsulant material 136 is formed, the microelectronic device 100 is singulated, for example by a saw process. The dicing tape 108 of FIG. 1D is subsequently removed. The microelectronic device 100 of this example may thus be manifested in a quad flatpack, no leads (QFN) package. In other versions of this example, the package type may be manifested as a small outline transistor (SOT) package, a small outline integrated circuit (SOIC) package, or a chip carrier, for example.

Figure 1F:
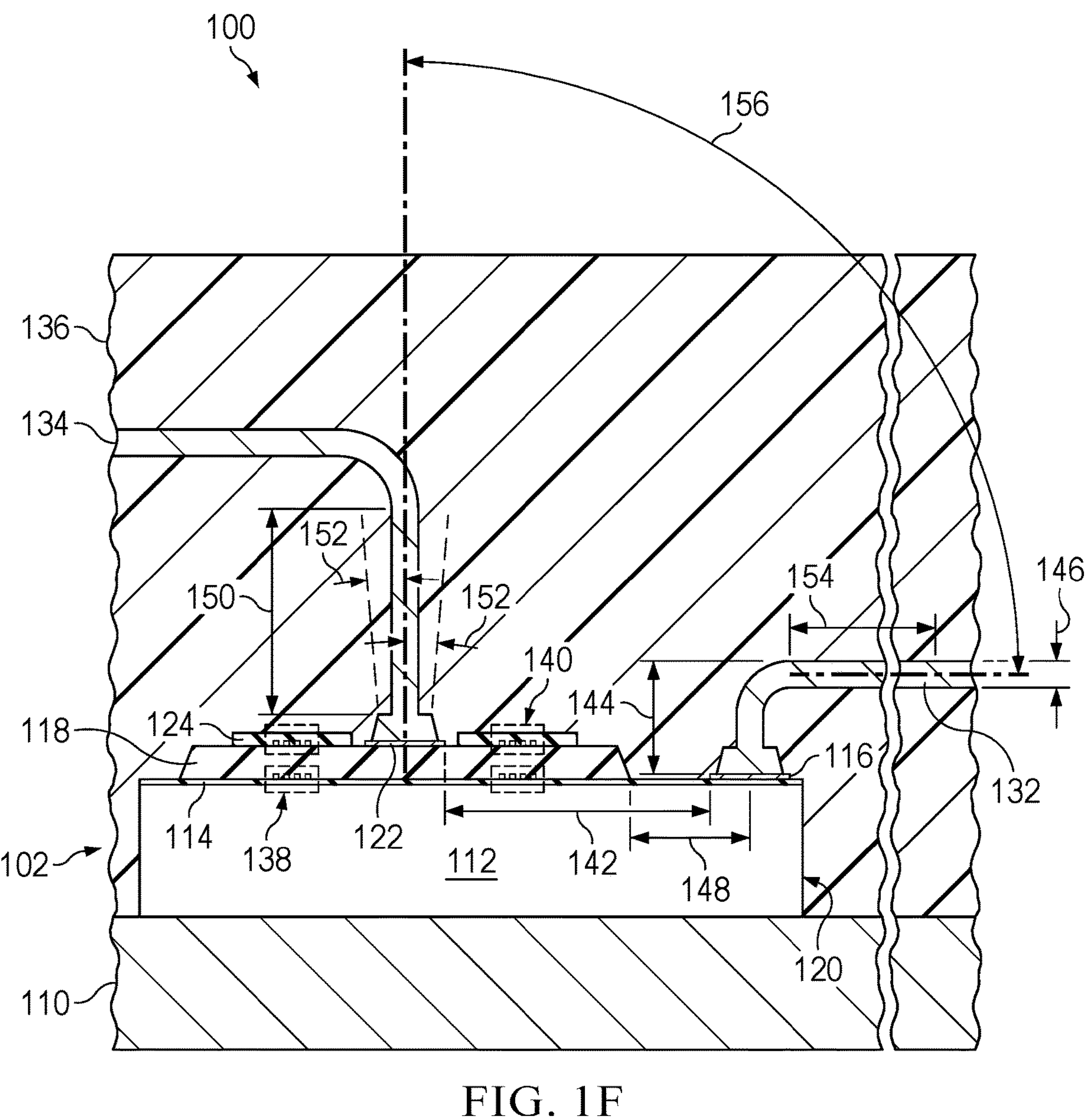

FIG. 1F is a cross section through the galvanic isolation device 102, through one of the low voltage wire bonds 132, and through one of the high voltage wire bonds 134. The lower isolation element 138 is depicted in FIG. 1F as a lower winding of an isolation transformer. The upper isolation element 140 is depicted in FIG. 1F as an upper winding of the isolation transformer. Other manifestations of the lower isolation element 138 and the upper isolation element 140 are within the scope of this example.

The upper bond pad 122 is laterally separated from the lower bond pad 116 by a pad separation distance 142. The pad separation distance 142 is sufficiently long to provide reliable operation of the galvanic isolation device 102 while a high voltage of at least 600 volts is applied between the high voltage wire bond 134 and the low voltage wire bond 132. The pad separation distance 142 may be 150 microns to 400 microns for an applied high voltage of 1000 volts, by way of example.

The low voltage wire bond 132 of this example includes a ball bond on the corresponding lower bond pad 116. The low voltage wire bond 132 has a loop height 144 directly over the perimeter 120 of the substrate 112 that is less than 5 times a wire diameter 146 of the low voltage wire bond 132, providing a low loop wire bond with an arced configuration. The low loop wire bond may advantageously reduce electric field stress in the encapsulant material 136 between the low voltage wire bond 132 and the high voltage wire bond 134. A center of the lower bond pad 116 is laterally separated from the dielectric plateau 118 by a lower pad space 148. The lower pad space 148 is sufficient to enable forming the low voltage wire bond 132 with the desired loop height 144. The lower pad space 148 may be 80 microns to 90 microns, by way of example. Forming the low voltage wire bond 132 with a stitch bond on the lower bond pad 116 would require a larger lower pad space 148, due to movement of a bonding capillary to form the stitch bond, undesirably increasing a total size of the galvanic isolation device 102.

The high voltage wire bond 134 of this example includes a ball bond on the corresponding upper bond pad 122. The high voltage wire bond 134 extends upward for a high voltage isolation length 150 that is greater than the pad separation distance 142, to reduce electric field stress in the encapsulant material 136 around the upper bond pad 122. The high voltage wire bond 134 extends upward, over the high voltage isolation length 150, within a deviation angle 152 from a vertical direction from the substrate 112, which encompasses deviations of the high voltage wire bond 134 produced by commonly used wire bonding equipment. The deviation angle 152 may be 10 degrees, by way of example.

The low voltage wire bond 132 extends for a low voltage isolation length 154 that may be greater than the pad separation distance 142. The high voltage wire bond 134 and the low voltage wire bond 132 extend away from each other at an isolation angle 156, over the high voltage isolation length 150 and the low voltage isolation length 154, to reduce electric field stress in the encapsulant material 136 between the high voltage wire bond 134 and the low voltage wire bond 132. The isolation angle 156 may be 60 degrees to 90 degrees. When an electric field is produced in the encapsulant material 136, due to the electric field produced by the potential difference applied to the high voltage wire bond 134 and the low voltage wire bond 132, there may be a risk of damage to the encapsulant material 136 due to voids or other defects which break down under the electric field. The risk of damage has been found to be non-linear as a function of the electric field strength, so that yield and reliability of the microelectronic device 100 are improved significantly for values of the isolation angle 156 above 60 degrees.

Figure 1G:
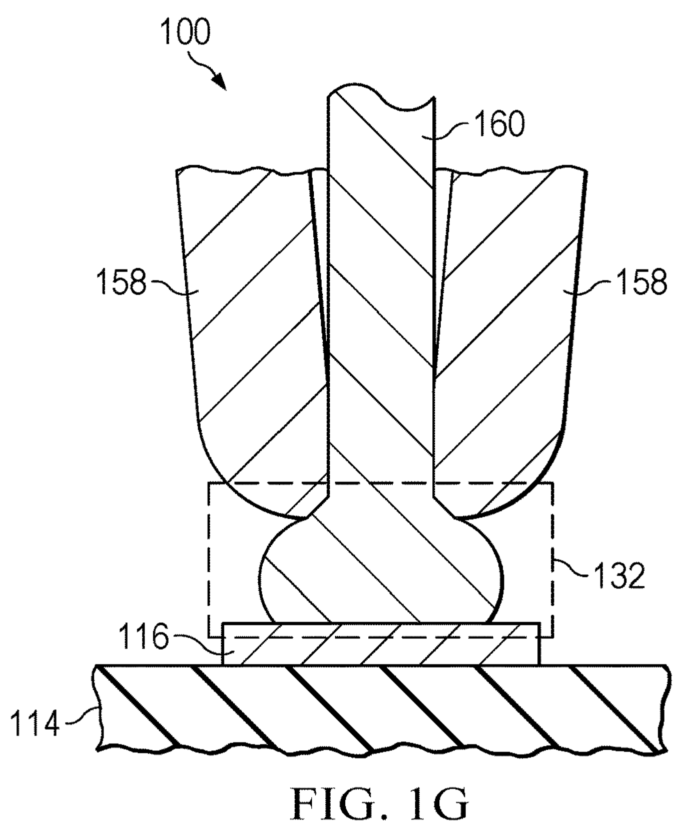

FIG. 1G is a cross section of one of the lower bond pads 116 during formation of the corresponding low voltage wire bond 132. The low voltage wire bond 132 is formed by a wire bonding operation using a wire bonding capillary 158. In the wire bonding operation, bond wire 160 extends through the wire bonding capillary 158 and has a wire ball at an end of the bond wire 160. The wire bonding capillary 158 presses, and may simultaneously vibrate, the wire ball against the lower bond pad 116 to thermo-mechanically form the wire ball bond of the low voltage wire bond 132 on the lower bond pad 116. The lower pad space 148 shown in FIG. 1F between the center of the lower bond pad 116 and the dielectric plateau 118 is sufficient to allow the wire bonding capillary 158 to form the wire ball bond of the low voltage wire bond 132 on the lower bond pad 116 without contacting the dielectric plateau 118.

Figure 1H:
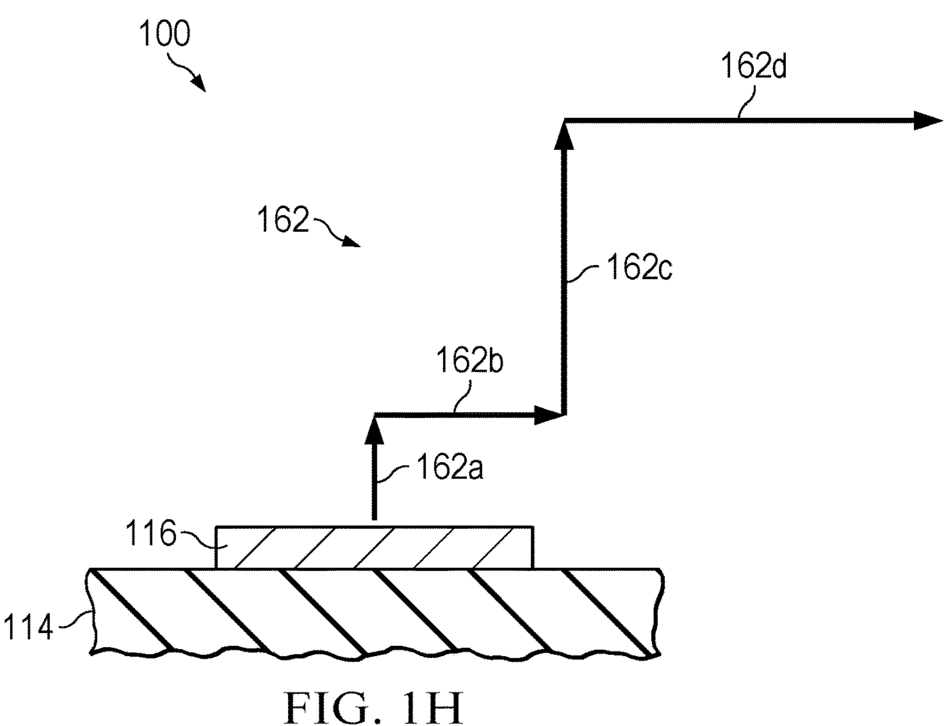

FIG. 1H is a cross section of the microelectronic device 100 showing an example capillary path 162 of the wire bonding capillary 158 of FIG. 1G during formation of the low loop wire bond of the low voltage wire bond 132 on the lower bond pad 116. The capillary path 162 includes a first path segment **162*a* in which the wire bonding capillary 158 is moved upward up from the lower bond pad 116 for a vertical distance that is less than the loop height 144 of FIG. 1F. Subsequently, the wire bonding capillary 158 is moved laterally away from the dielectric plateau 118 of FIG. 1F along a second path segment 162*b* of the capillary path 162 for a lateral distance that is greater than the vertical distance of the first path segment 162*a*. Moving the wire bonding capillary 158 along the first path segment 162*a* followed by the second path segment 162*b* sets a main portion of the loop height 144**.

Subsequently, the wire bonding capillary 158 may be moved upward along a third path segment **162*c* of the capillary path 162 for a vertical distance in order to clear any elements of the microelectronic device 100 under the low voltage wire bond 132. Subsequently, the wire bonding capillary 158 is moved laterally along a fourth path segment 162*d* of the capillary path 162 to the corresponding first component bond pad 126*a* of the electronic component 104, not specifically shown in FIG. 1H. Forming the low voltage wire bond 132 using the capillary path 162 may advantageously provide a desired loop height 144 with sufficient strength in the low voltage wire bond 132 to reduce wire movement, sometimes referred to as wire sweep, during injection of the encapsulant material 136**.

Figure 2A:
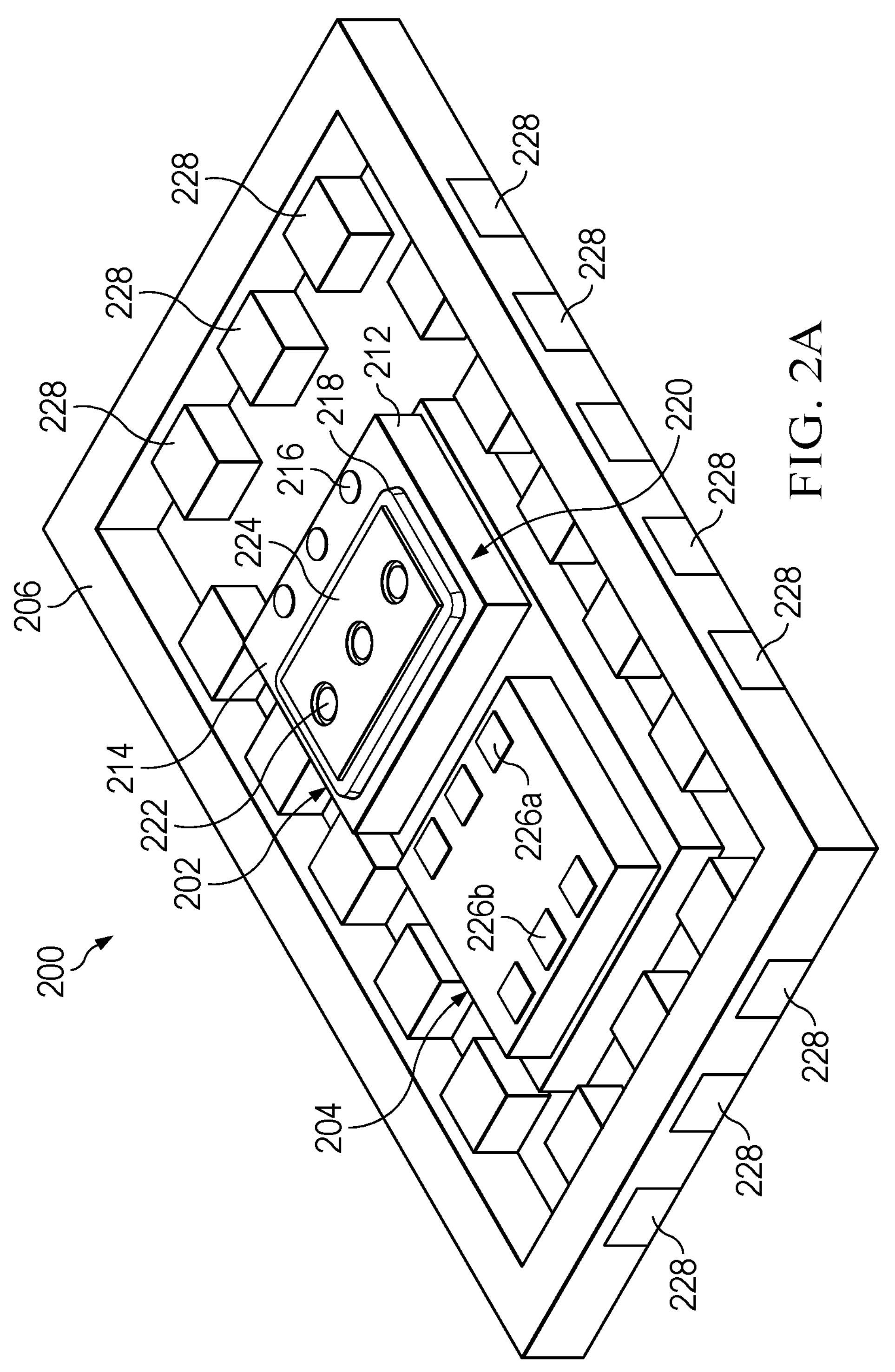
FIG. 2A through FIG. 2H are perspectives and cross sections of an example microelectronic device including a galvanic isolation device, depicted in stages of an example method of formation.

FIG. 2A through FIG. 2H are perspectives and cross sections of an example microelectronic device including a galvanic isolation device, depicted in stages of an example method of formation. Referring to FIG. 2A, the microelectronic device 200 includes the galvanic isolation device 202 and an electronic component 204. The galvanic isolation device 202 may be implemented as an isolation transformer, an isolation capacitor, an optical isolator, or a magnetic isolator, by way of example.

In this example, the galvanic isolation device 202 and the electronic component 204 may be mounted on a chip carrier 206. The chip carrier 206 includes external leads 228 around a periphery of the microelectronic device 200. The external leads 228 are electrically conductive.

The galvanic isolation device 202 includes a substrate 212, and a lower dielectric layer 214 over the substrate 212. The galvanic isolation device 202 includes lower bond pads 216 over the lower dielectric layer 214. The lower bond pads 216 are connected to a lower isolation element 238, shown in FIG. 2F, of the galvanic isolation device 202.

The galvanic isolation device 202 includes a dielectric plateau 218 over the lower isolation element 238 and the lower dielectric layer 214. The dielectric plateau 218 does not extend to the lower bond pads 216, and may not extend to a perimeter 220 of the substrate 212.

The galvanic isolation device 202 includes upper bond pads 222 over the dielectric plateau 218. The upper bond pads 222 are connected to an upper isolation element 240, shown in FIG. 2F, located over the dielectric plateau 218, above the lower isolation element 238. The dielectric plateau 218 may include inorganic dielectric material extending from the lower isolation element 238 to the upper isolation element 240. The galvanic isolation device 202 may optionally include a protective layer 224 over the upper isolation element, exposing the upper bond pads 222.

The electronic component 204 may be implemented as an integrated circuit, a discrete component, a sensor, a MEMS device, or an optoelectronic device, by way of example. The electronic component 204 includes first component bond pads 226*a* for connections to the galvanic isolation device 202, and second component bond pads 226*b* for other connections.

Figure 2B:
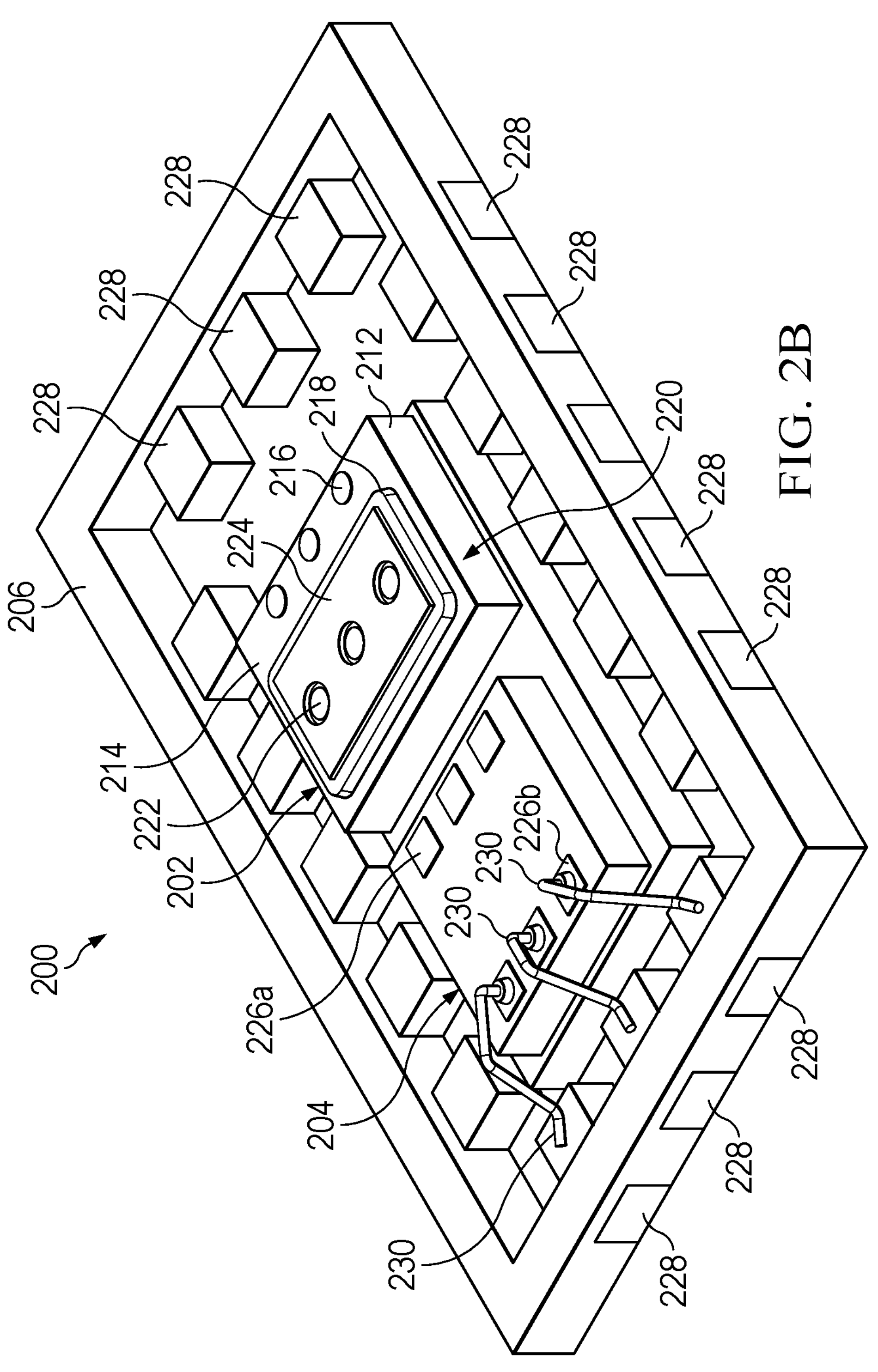

Referring to FIG. 2B, component wire bonds 230 are formed on the second component bond pads 226*b* of the electronic component 204 and instances of the external leads 228 of the chip carrier 206, by a wire bond operation, connecting the second component bond pads 226*b* to the instances of the external leads 228. The component wire bonds 230 may include ball bonds on the second component bond pads 226*b* and stitch bonds on the external leads 228, as depicted in FIG. 2B. Other implementations of the component wire bonds 230 are within the scope of this example. The component wire bonds 230 may be formed as disclosed in reference to the component wire bonds 130 of FIG. 1B.

Figure 2C:
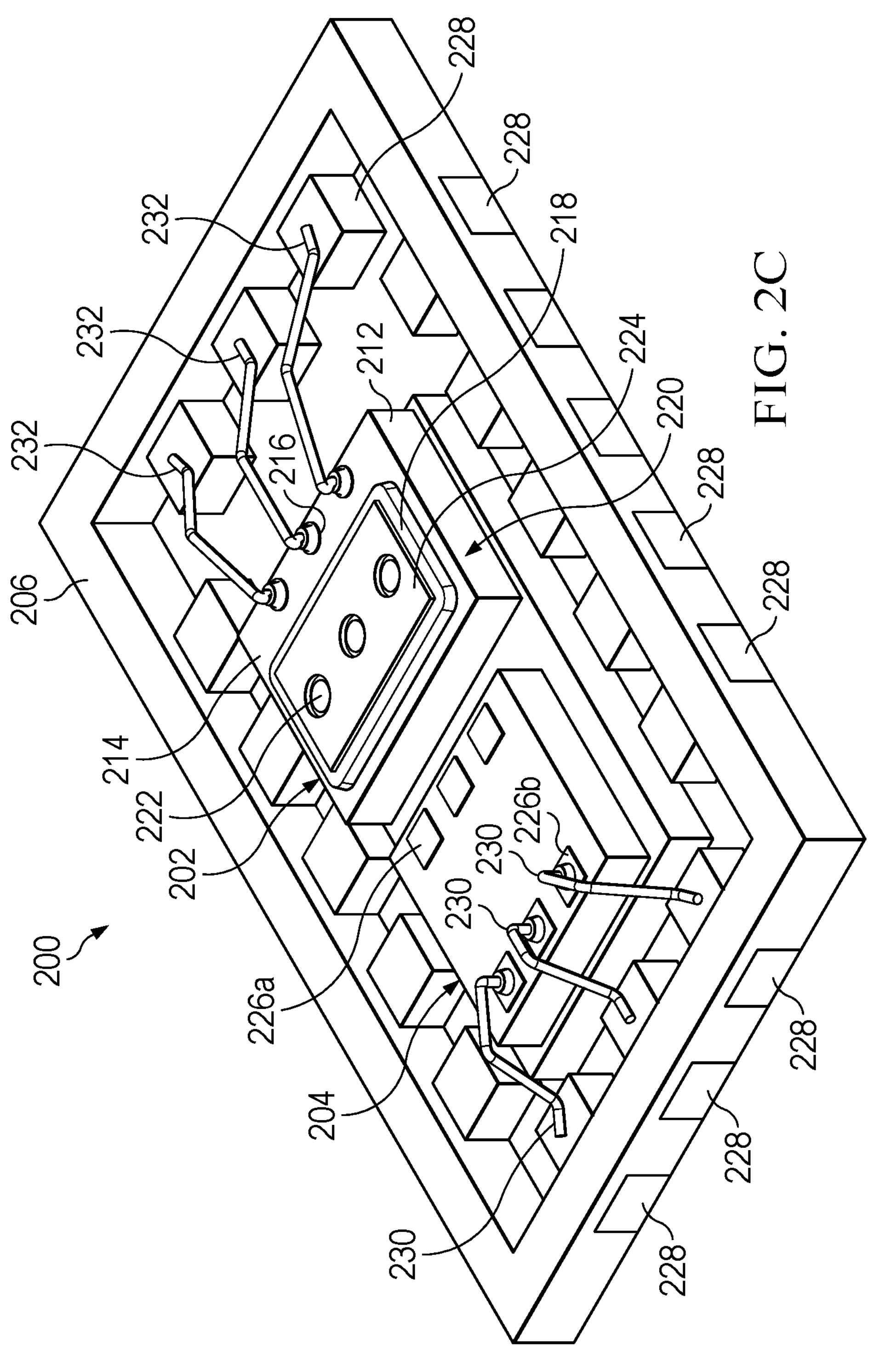

Referring to FIG. 2C, low voltage wire bonds 232 are formed on the lower bond pads 216 of the galvanic isolation device 202 and instances of the external leads 228, by a wire bond operation, connecting the lower bond pads 216 to the instances of the external leads 228. The low voltage wire bonds 232 are formed with low loop height using a folded wire configuration, as explained in reference to FIG. 2F. The low voltage wire bonds 232 may have compositions similar to the component wire bonds 230. The low voltage wire bonds 232 may include ball bonds on the lower bond pads 216 and stitch bonds on the instances of the external leads 228, as depicted in FIG. 2C. Other implementations of the low voltage wire bonds 232 are within the scope of this example.

Figure 2D:
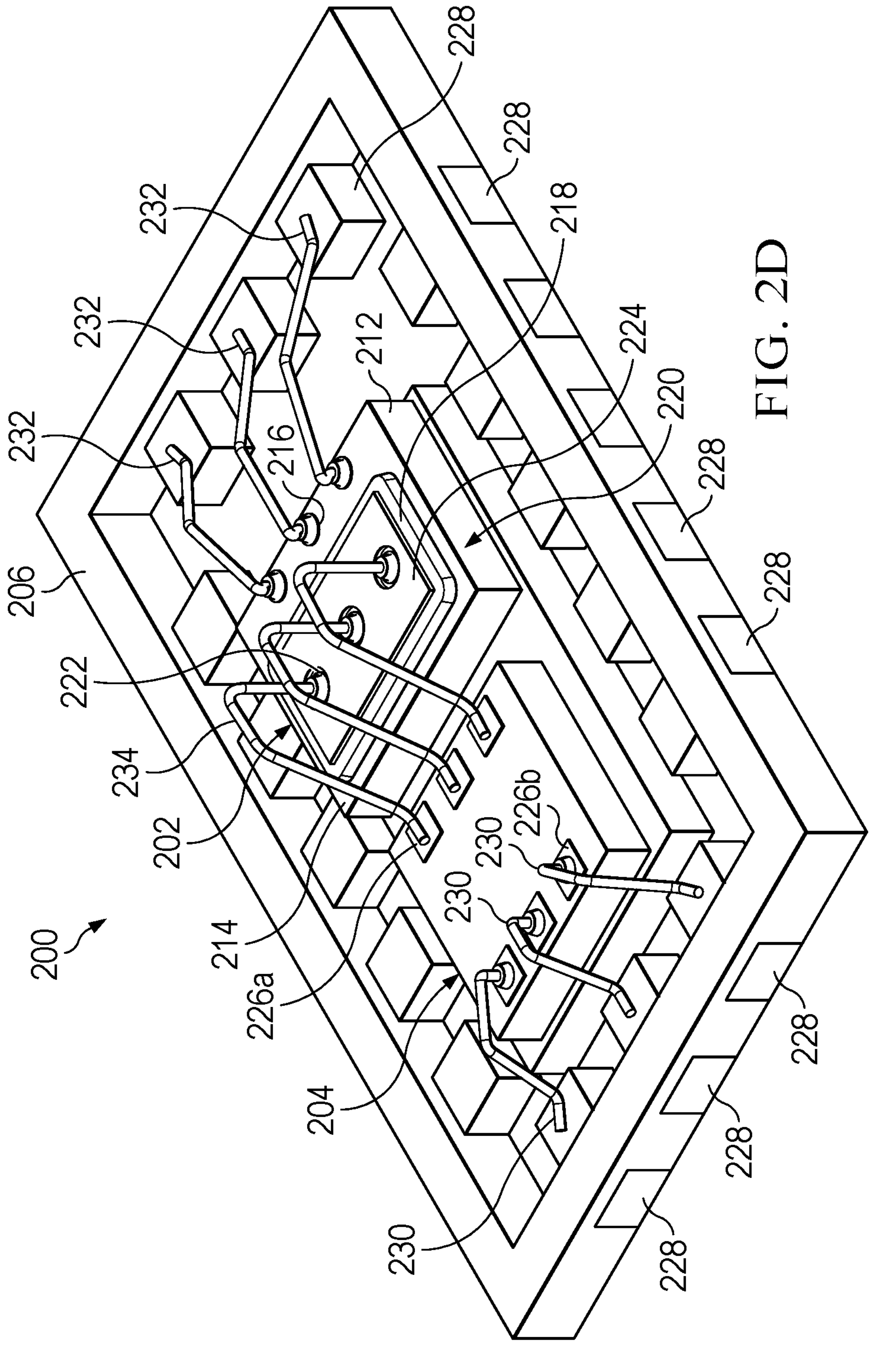

Referring to FIG. 2D, high voltage wire bonds 234 are formed on the upper bond pads 222 of the galvanic isolation device 202 and the first component bond pads 226*a* of the electronic component 204, by a wire bond operation, connecting the upper bond pads 222 to the first component bond pads 226*a*. The high voltage wire bonds 234 extend upward from the upper bond pads 222 for a distance that is greater than a lateral distance between the upper bond pads 222 and the lower bond pads 216. The high voltage wire bonds 234 may have compositions similar to the component wire bonds 230. The high voltage wire bonds 234 include ball bonds on the upper bond pads 222 and stitch bonds on the instances of the external leads 228, as depicted in FIG. 2D.

Figure 2E:
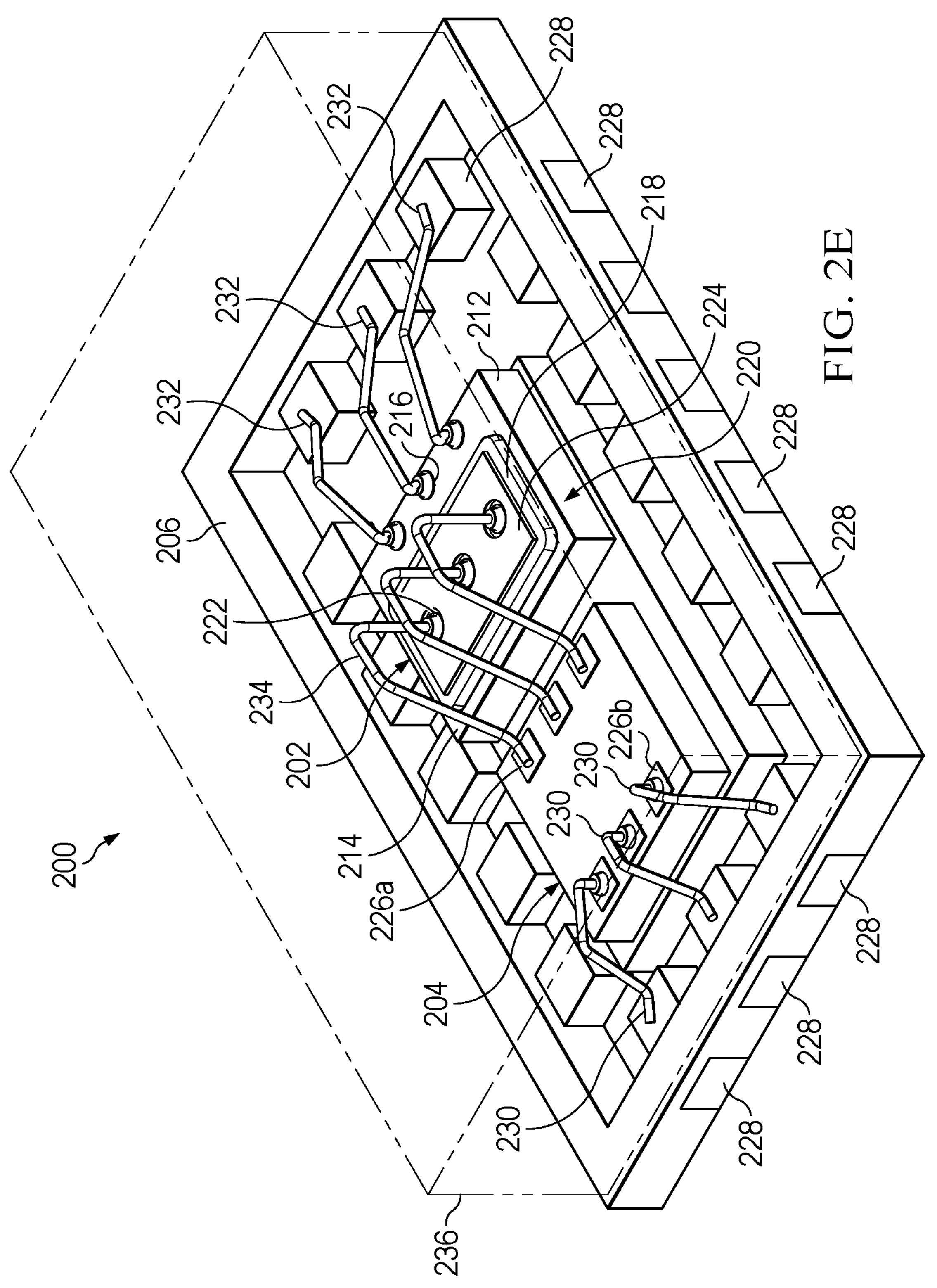

Referring to FIG. 2E, an encapsulant material 236 is formed on the chip carrier 206, the galvanic isolation device 202, and the electronic component 204, surrounding the component wire bonds 230, the low voltage wire bonds 232, and the high voltage wire bonds 234. The encapsulant material 236 may have a composition similar to the encapsulant material 136, and may be formed by a similar process, as disclosed in reference to FIG. 1E.

Figure 2F:
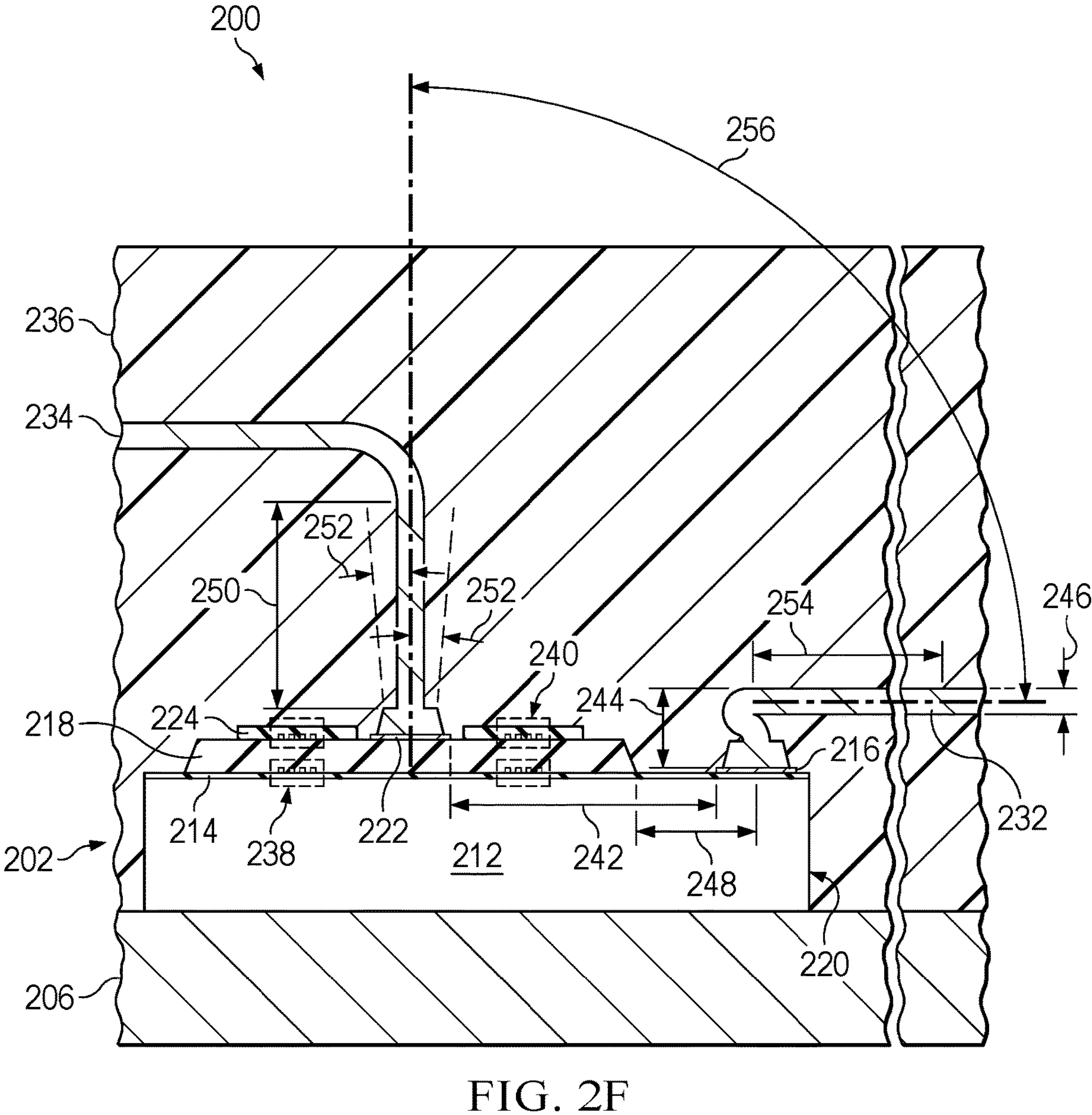

FIG. 2F is a cross section through the galvanic isolation device 202, through one of the low voltage wire bonds 232, and through one of the high voltage wire bonds 234. The lower isolation element 238 is depicted in FIG. 2F as a lower winding of an isolation transformer. The upper isolation element 240 is depicted in FIG. 2F as an upper winding of the isolation transformer. Other manifestations of the lower isolation element 238 and the upper isolation element 240 are within the scope of this example.

The upper bond pad 222 is laterally separated from the lower bond pad 216 by a pad separation distance 242. The pad separation distance 242 is sufficiently long to provide reliable operation of the galvanic isolation device 202 while a high voltage of at least 600 volts is applied between the high voltage wire bond 234 and the low voltage wire bond 232.

The low voltage wire bond 232 of this example includes a ball bond on the corresponding lower bond pad 216. The low voltage wire bond 232 has a loop height 244 directly over the perimeter 220 of the substrate 212 that is less than 5 times a wire diameter 246 of the low voltage wire bond 232, providing a low loop wire bond. The low voltage wire bond 232 of this example has a folded wire configuration, in which the bond wire is folded back onto the bond wire extending from the ball bond, providing a desired loop height 244. The low loop wire bond of the low voltage wire bond 232 of this example may provide the advantage disclosed in reference to the low voltage wire bond 132 of FIG. 1F.

A center of the lower bond pad 216 is laterally separated from the dielectric plateau 218 by a lower pad space 248, which is sufficient to enable forming the low voltage wire bond 232 with the folded wire configuration and the desired loop height 244. The lower pad space 248 may be 80 microns to 90 microns, by way of example, accruing the advantage of lower size for the galvanic isolation device 202.

The high voltage wire bond 234 of this example includes a ball bond on the corresponding upper bond pad 222. The high voltage wire bond 234 extends upward for a high voltage isolation length 250 that is greater than the pad separation distance 242. The high voltage wire bond 234 extends upward, over the high voltage isolation length 250, within a deviation angle 252 from a vertical direction from the substrate 212. The deviation angle 252 may be 10 degrees, by way of example.

The low voltage wire bond 232 extends for a low voltage isolation length 254 that may be greater than the pad separation distance 242. The high voltage wire bond 234 and the low voltage wire bond 232 extend away from each other at an isolation angle 256, over the high voltage isolation length 250 and the low voltage isolation length 254. The isolation angle 256 may be 60 degrees to 90 degrees, which may accrue the advantage of improved reliability explained in reference to the isolation angle 156 of FIG. 1F.

Figure 2G:
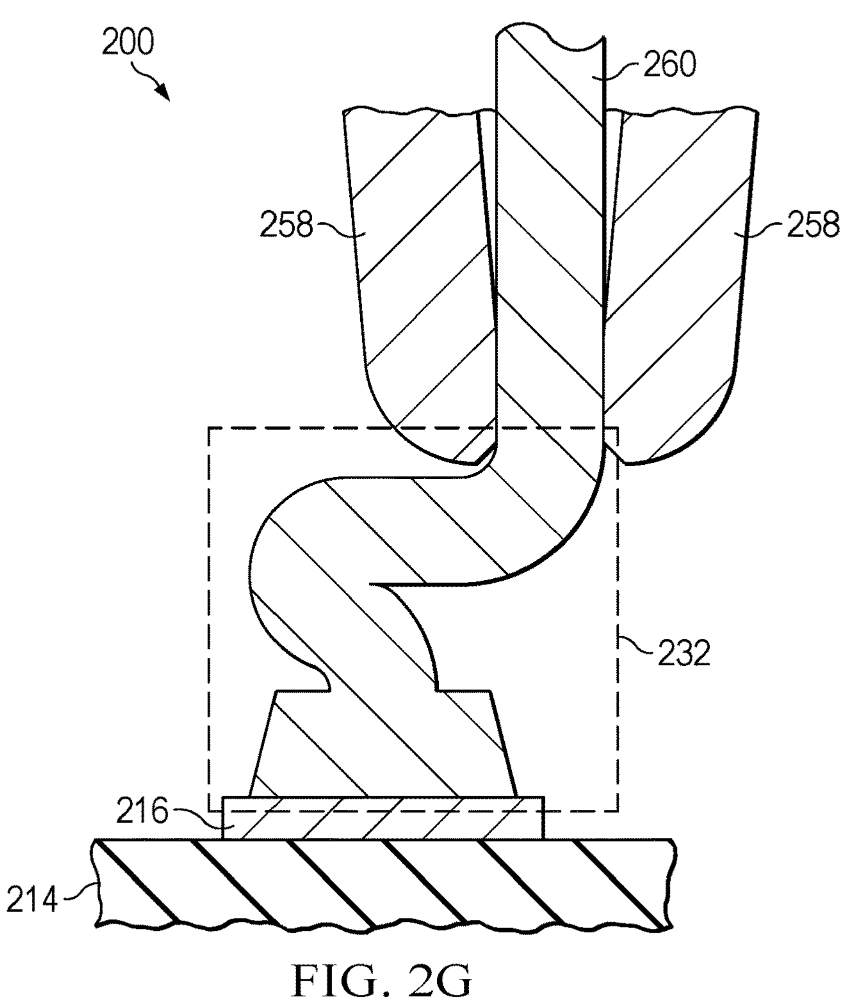

FIG. 2G is a cross section of one of the lower bond pads 216 during formation of the corresponding low voltage wire bond 232. The low voltage wire bond 232 is formed by a wire bonding operation using a wire bonding capillary 258. In the wire bonding operation, bond wire 260 extends through the wire bonding capillary 258. A ball bond is thermo-mechanically formed on the lower bond pad 216 by pressing, and optionally vibrating, a wire ball at the end of the bond wire onto the lower bond pad 216. The wire bonding capillary 258 is moved a few microns toward the dielectric plateau 218 of FIG. 1F, and subsequently moved upward and back over the lower bond pad 216, then moved downward to form a fold in the bond wire. The lower pad space 248 shown in FIG. 2F between the center of the lower bond pad 216 and the dielectric plateau 218 is sufficient to allow the wire bonding capillary 258 to form the fold in the bond wire without contacting the dielectric plateau 218.

Figure 2H:
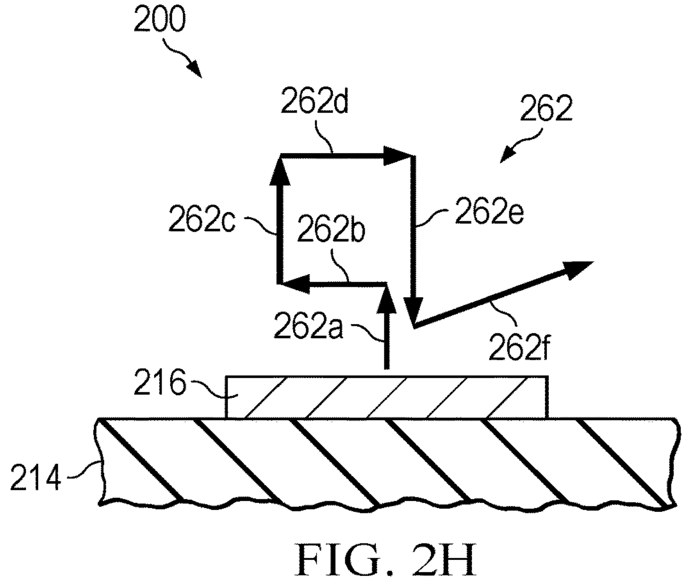

FIG. 2H is a cross section of the microelectronic device 200 showing an example capillary path 262 of the wire bonding capillary 258 of FIG. 2G during formation of the low loop wire bond with the folded wire configuration of the low voltage wire bond 232 on the lower bond pad 216. The capillary path 262 includes a first path segment 262*a* in which the wire bonding capillary 258 is moved upward up from the lower bond pad 216 after forming a ball bond on the lower bond pad 216, for a vertical distance that is approximately the wire diameter 246 of FIG. 2F. Subsequently, the wire bonding capillary 258 is moved laterally toward the dielectric plateau 218 of FIG. 2F along a second path segment 262*b* of the capillary path 262 for a lateral distance that is greater than twice the wire diameter 246. Subsequently, the wire bonding capillary 258 is moved upward along a third path segment 262*c* of the capillary path 262 for a vertical distance between one and three times the wire diameter 246. Subsequently, the wire bonding capillary 258 is moved laterally along a fourth path segment 262*d* of the capillary path 262 to a position above the ball bond on the lower bond pad 216. Subsequently, the wire bonding capillary 258 may be moved downward along a fifth path segment 262*e* of the capillary path 262 to press the bond wire extending from the wire bonding capillary 258 against the bond wire extending from the ball bond, forming the folded configuration. Subsequently, the wire bonding capillary 258 is moved upward and laterally along a sixth path segment 262*f* of the capillary path 262 to the corresponding first component bond pad 226*a* of the electronic component 204, not specifically shown in FIG. 2H. Forming the low voltage wire bond 232 using the capillary path 262 may advantageously provide a desired loop height 244 with sufficient strength in the low voltage wire bond 232 to reduce wire movement, sometimes referred to as wire sweep, during injection of the encapsulant material 236.

Figure 3A:
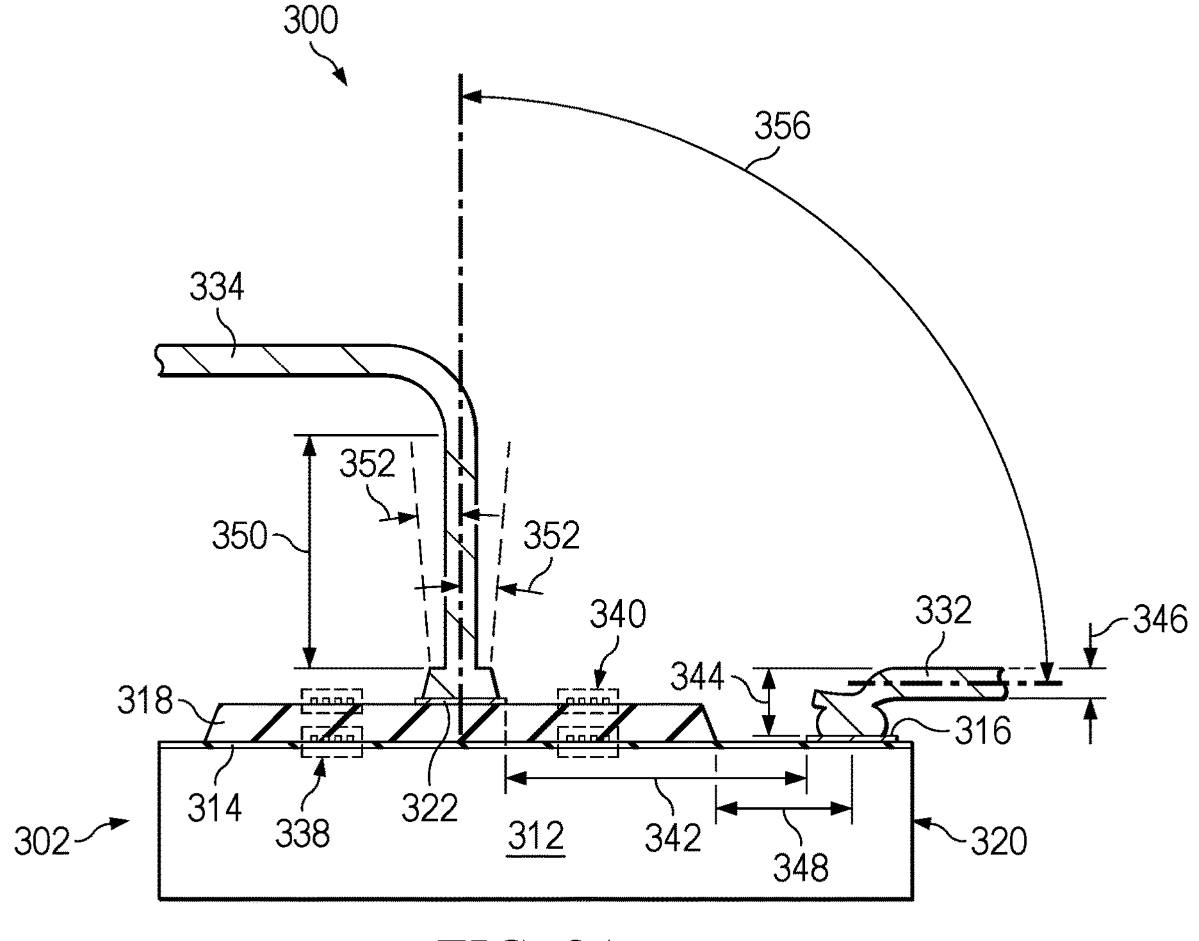
FIG. 3A through FIG. 3C are cross sections of an example microelectronic device with an alternative version of the low voltage wire bond.
Figure 3B:
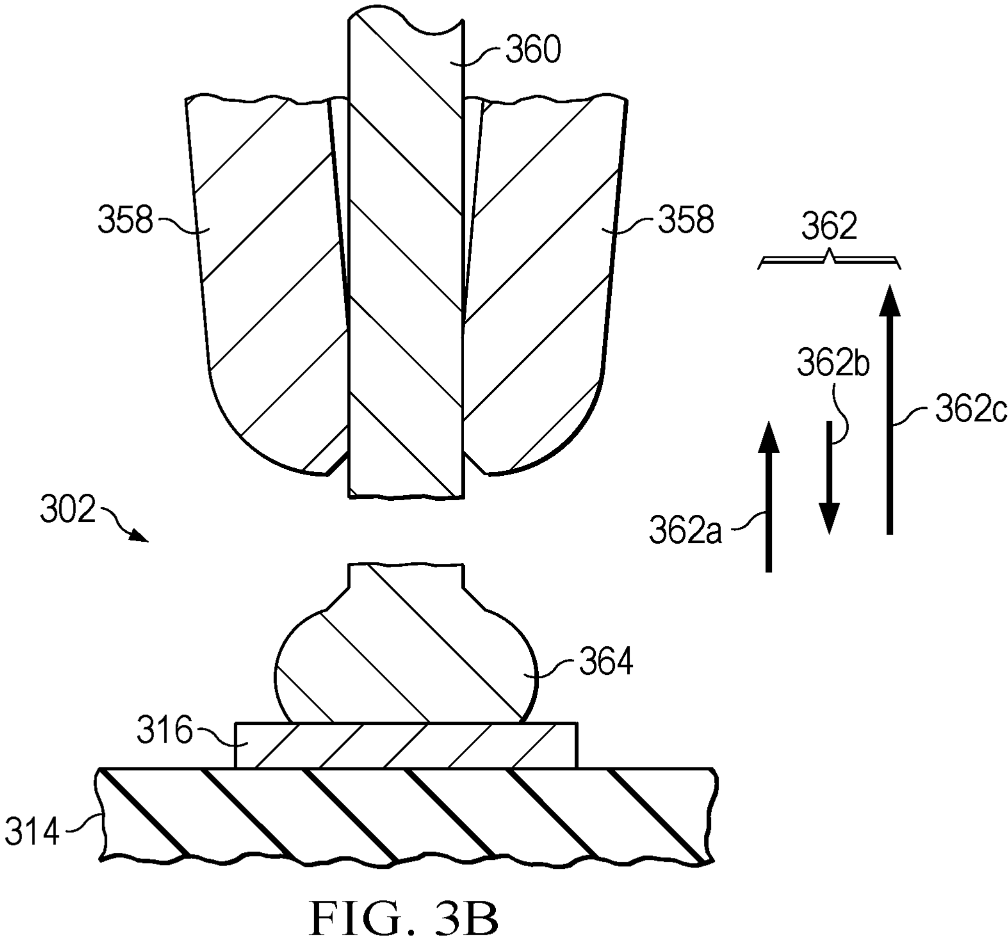
Figure 3C:
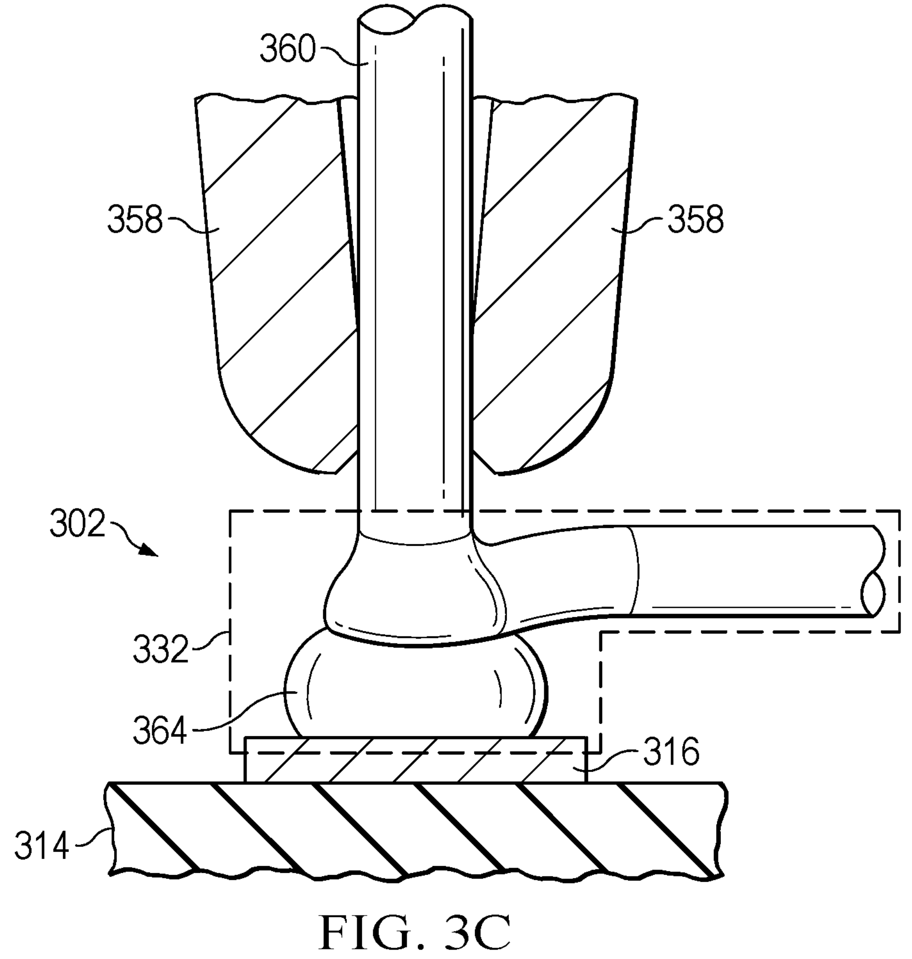

FIG. 3A through FIG. 3C are cross sections of an example microelectronic device with an alternative version of the low voltage wire bond. Referring to FIG. 3A, the microelectronic device 300 includes a galvanic isolation device 302 including a substrate 312 with a perimeter 320. The galvanic isolation device 302 further includes a lower dielectric layer 314 over the substrate 312, and a lower bond pad 316 over the lower dielectric layer 314. The galvanic isolation device 302 also includes a lower isolation element 338 over the lower dielectric layer 314, connected to the lower bond pad 316. The galvanic isolation device 302 includes a dielectric plateau 318 over the lower isolation element 338 and the lower dielectric layer 314. The dielectric plateau 318 does not extend to the lower bond pads 316, and may not extend to a perimeter 320 of the substrate 312. The galvanic isolation device 302 further includes an upper bond pad 322 and an upper isolation element 340, both over the dielectric plateau 318. The upper bond pad 322 is connected to the upper isolation element 340. The dielectric plateau 318 may include inorganic dielectric material extending from the lower isolation element 338 to the upper isolation element 340. The upper bond pad 322 is laterally separated from the lower bond pad 316 by a pad separation distance 342. The pad separation distance 342 is sufficiently long to provide reliable operation of the galvanic isolation device 302 while a high voltage of at least 600 volts is applied between the high voltage wire bond 334 and the low voltage wire bond 332.

The low voltage wire bond 332 of this example includes a stand-off stitch bond, also known as a ball stitch on ball bond or a reverse stand-off stitch bond, on the lower bond pad 316. The low voltage wire bond 332 has a loop height 344 directly over the perimeter 320 of the substrate 312 that is less than 5 times a wire diameter 346 of the low voltage wire bond 332, providing a low loop wire bond. The low loop wire bond of the low voltage wire bond 332 of this example may provide the advantage disclosed in reference to the low voltage wire bond 132 of FIG. 1F.

A center of the lower bond pad 316 is laterally separated from the dielectric plateau 318 by a lower pad space 348, which is sufficient to enable forming the low voltage wire bond 332 with stand-off stitch bond configuration and the desired loop height 344. The lower pad space 348 may be 80 microns to 90 microns, by way of example, accruing the advantage of lower size for the galvanic isolation device 302.

The high voltage wire bond 334 of this example includes a ball bond on the corresponding upper bond pad 322, with bond wire extending upward for a high voltage isolation length 350 that is greater than the pad separation distance 342, within a deviation angle 352 of 10 degrees from a vertical direction from the substrate 312. The high voltage wire bond 334 and the low voltage wire bond 332 extend away from each other at an isolation angle 356 of 60 degrees to 90 degrees, which may accrue the advantage of improved reliability explained in reference to the isolation angle 156 of FIG. 1F.

FIG. 3B and FIG. 3C depict formation of the low voltage wire bond 332. Referring to FIG. 3B, a stud bump 364 is formed on the lower bond pad 316. The stud bump 364 may be formed by simultaneously pressing, and optionally vibrating, a wire ball at an end of the bond wire 360 onto the lower bond pad 316 using a wire bonding capillary 358, thermo-mechanically forming a bump on the lower bond pad 316. The wire bonding capillary 358 may be subsequently moved along a capillary path 362, which includes moving upward along a first path segment 362*a* to stretch the bond wire 360 above the bump. The wire bonding capillary 358 may be subsequently moved downward along a second path segment 362*b* to form a weak zone in the bond wire 360 above the bump. The wire bonding capillary 358 may then be moved upward along a third path segment 362*c* to break the bond wire 360 above the bump, leaving the bump in place on the lower bond pad 316 to provide the stud bump 364.

Referring to FIG. 3C, the low voltage wire bond 332 is formed with the stand-off stitch bond by forming a ball bond on an external lead, not specifically shown in FIG. 3C, of the microelectronic device 300, using the wire bonding capillary 358. The wire bonding capillary 358 is subsequently moved over the stud bump 364, trailing the bond wire 360. The wire bonding capillary 358 presses the bond wire 360 against the stud bump 364, thermo-mechanically forming a bond between the bond wire 360 and the stud bump 364. The wire bonding capillary 358 is subsequently moved upward to break the bond wire 360 above the stud bump 364, leaving the bond wire 360 in place on the stud bump 364 to provide the stand-off stitch bond of the low voltage wire bond 332. The stand-off stitch bond may advantageously provide a desired low loop height 344 and high isolation angle 356, shown in FIG. 3A.

Various features of the examples disclosed herein may be combined in other manifestations of example microelectronic devices. For example, either of the microelectronic devices 100 or 200 may have an SOT package, a QFN package, or a chip carrier. Any of the component wire bonds 130 or 230, the low voltage wire bonds 132 or 232, or the high voltage wire bonds 134 or 234 may be formed using gold bonding wire, copper bonding wire, or palladium-coated copper bonding wire. Any of the low voltage wire bonds 132 or 232 may be formed with arced configurations, folded wire configurations, or stand-off stitch bonds.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
- an isolation component, including:
  - a substrate;
  - a lower isolation element over the substrate;
  - lower bond pads connected to the lower isolation element;
  - a dielectric plateau over the lower isolation element, wherein the dielectric plateau does not extend to the lower bond pads;
  - an upper isolation element over the dielectric plateau; and
  - upper bond pads connected to the upper isolation element, laterally separated from the lower bond pads by an isolation distance;
- high voltage wire bonds on the upper bond pads, wherein the high voltage wire bonds extend upward, within 10 degrees of vertical, for a vertical distance greater than the isolation distance; and
- low voltage wire bonds on the lower bond pads, wherein the low voltage wire bonds have a loop height over the substrate that is less than 5 times a wire diameter of the low voltage wire bonds.

2. The microelectronic device of claim 1, wherein the high voltage wire bonds and the low voltage wire bonds extend away from each other at an isolation angle greater than 60 degrees.

3. The microelectronic device of claim 1, wherein the dielectric plateau is less than 90 microns away from a center of one of the lower bond pads.

4. The microelectronic device of claim 1, wherein the high voltage wire bonds include ball bonds on the upper bond pads.

5. The microelectronic device of claim 1, wherein the low voltage wire bonds include ball bonds on the lower bond pads.

6. The microelectronic device of claim 1, wherein the low voltage wire bonds include stand-off stitch bonds on the lower bond pads.

7. The microelectronic device of claim 1, wherein the low voltage wire bonds include ball bonds with folded wire configurations on the lower bond pads.

8. The microelectronic device of claim 1, wherein the low voltage wire bonds and the high voltage wire bonds include palladium-coated copper bonding wires.

9. The microelectronic device of claim 1, further comprising an encapsulant material contacting the isolation component and surrounding the high voltage wire bonds and the low voltage wire bonds.

10. A microelectronic device, comprising:
- an isolation transformer, including:
  - a substrate;
  - a lower winding over the substrate;
  - lower bond pads connected to the lower winding;
  - a dielectric plateau over the lower winding, wherein the dielectric plateau does not extend to the lower bond pads;
  - an upper winding over the dielectric plateau; and
  - upper bond pads connected to the upper winding, laterally separated from the lower bond pads by an isolation distance;
- high voltage wire bonds on the upper bond pads, wherein the high voltage wire bonds extend upward, within 10 degrees of vertical, for a vertical distance greater than the isolation distance; and
- low voltage wire bonds on the lower bond pads, wherein the low voltage wire bonds have a loop height over the substrate that is less than 5 times a wire diameter of the low voltage wire bonds.

11. The microelectronic device of claim 10, wherein the dielectric plateau is less than 90 microns away from a center of one of the lower bond pads.

12. The microelectronic device of claim 10, wherein the high voltage wire bonds include ball bonds on the upper bond pads.

13. The microelectronic device of claim 10, wherein the low voltage wire bonds include ball bonds on the lower bond pads.

14. The microelectronic device of claim 10, wherein the low voltage wire bonds include stand-off stitch bonds on the lower bond pads.

15. The microelectronic device of claim 10, wherein the low voltage wire bonds include ball bonds with folded wire configurations on the lower bond pads.

* * * * *